United States Patent [19]

Miccoli et al.

[11] Patent Number: 4,774,483
[45] Date of Patent: Sep. 27, 1988

[54] DIAGONALLY COUPLED MAGNETOSTATIC WAVE RESONATORS

[75] Inventors: Giuseppe Miccoli, Rome, Italy; Kok-Wai Chang, Sunnyvale, Calif.; William E. Kunz, Foster City, Calif.; Waguih Ishak, Cupertino, Calif.

[73] Assignee: Hewlett-Packard Company, Palo Alto, Calif.

[21] Appl. No.: 94,961

[22] Filed: Sep. 9, 1987

[51] Int. Cl.$^4$ .......................... H01P 7/00; H01P 7/06; H03H 9/24
[52] U.S. Cl. .................................. 333/219; 333/202; 333/235; 333/245
[58] Field of Search ................. 333/150–155, 333/193–196, 141, 142, 148, 149, 219, 235, 202, 204, 205, 245, 246

[56] References Cited

U.S. PATENT DOCUMENTS

| | | | |
|---|---|---|---|
| 4,314,214 | 2/1982 | Castera et al. | 333/141 |
| 4,528,529 | 7/1985 | Huijer | 333/149 |

Primary Examiner—Marvin L. Nussbaum
Attorney, Agent, or Firm—John A. Frazzini

[57] ABSTRACT

A magnetostatic wave resonator having a transducer oriented such that it is tangent at all points to a wavefront of a traveling wave component of a resonant mode of the resonant cavity. In a rectangular cavity of width $L_x$ and length $L_y$, the transducer is perpendicular to the wavevector $k=(m\pi/L_x)e_x+(n\pi/L_y)e_y$ for some nonzero integers m and n, whereby the transducer optimally transfers energy into the resonant mode that is a linear superposition of travelling waves that includes this wavevector. This enhances coupling into the resonant mode of interest and reduces the amount of coupling into spurious modes.

6 Claims, 3 Drawing Sheets

FIG 2

TABLE 1
MAGNETOSTATIC WAVES IN THIN YIG FILMS

| MODE | DISPERSION RELATIONS | DISPERSION DIAGRAM |
|---|---|---|
| Surface Wave | $\exp(2k) = \dfrac{(2\pi M)^2}{(H_i + 2\pi M)^2 - (\omega/\gamma)^2}$ <br> $\omega_i = \gamma\sqrt{H_i(H_i + 4\pi M)}$ <br> $\omega_h = \gamma(H_i + 2\pi M)$ | graph of $\omega$ vs $k$, with $\omega_h$ and $\omega_i$ marked |
| Backward Volume Wave | $2\cot(\alpha k) = \alpha - \alpha^{-1}$ <br> $\omega_i = \gamma H_i$ <br> $\omega_h = \gamma\sqrt{H_i(H_i + 4\pi M)}$ | graph of $\omega$ vs $k$, with $\omega_h$ and $\omega_i$ marked |
| Forward Volume Wave | $\tan(k/2\alpha) = \alpha$ <br> $\omega_i = \gamma H_i$ <br> $\omega_h = \gamma\sqrt{H_i(H_i + 4\pi M)}$ | graph of $\omega$ vs $k$, with $\omega_h$ and $\omega_i$ marked |

$\alpha = [[(\omega/\gamma)^2 - H_i^2] \times [H_i(H_i + 4\pi M) - (\omega/\gamma)^2]]^{-1}$ $k$ = wave number = $2\pi$/wavelength = $2\pi/\lambda$ $4\pi M$ = YIG saturation magnetization $\gamma$ = gyromagnetic ratio = 2.8 MHz/oersted $H_i$ = internal field = $H_0 + H_{anisotropy}$

DIAGONALLY COUPLED MAGNETOSTATIC WAVE RESONATORS

BACKGROUND OF THE INVENTION

This invention relates in general to magnetostatic wave (MSW) devices and relates more particularly to MSW resonators. In FIG. 1 is presented a previous MSW resonator. In MSW wave devices, a magnetic medium is utilized to transport magnetostatic waves. An input transducer responsive to applied electromagnetic signals launches the waves in the magnetic medium and an output transducer responsive to the MSW waves generates output signals.

In FIG. 1 is illustrated a previous MSW resonator. In this resonator, a thin film 11 of a ferrimagnetic material such as yttrium iron garnet (YIG) is grown by liquid phase epitaxy (LPE) on a gadolinium gallium garnet (GGG) substrate. The YIG film is utilized as the magnetic medium in which magnetostatic waves are transported. A first microstrip conductor 12 is formed adjacent to YIG film 11 and parallel to a side 14 of the film. This microstrip conductor functions as an input transducer. When an electrical signal is applied to microstrip conductor 12, the resulting current in this conductor produces a magnetic field encircling this conductor. This field pushes on the magnetic dipoles in the YIG film, thereby launching MSW waves in the YIG film in a direction k perpendicular to axis 14 of microstrip conductor 12. The vector k is the wavevector of the MSW waves induced in film 11. The magnitude k of k (also referred to as the wavenumber) is equal to $2\pi$ divided by the wavelength of the magnetostatic wave. For the orientation shown in FIG. 1, k is in the negative y direction. A second microstrip conductor 15 is responsive to the MSW waves YIG film 11 and functions as the output transducer of the resonator.

YIG film 11 is in the form of a rectangle of width $L_x$ and length $L_y$. In such a rectangular YIG film, the fundamental MSW modes are of the forms $\sin(k_x \cdot L_x) \cdot \sin(k_y \cdot L_y)$. Resonances occur when $k_x \cdot L_x / \pi$ is equal to some integer m and $k_y \cdot L_y / \pi$ is equal to some integer n. The relationship between the frequency $f_{mn}$ of this resonance and the magnitude $k_{mn}$ of this resonance is nonlinear and depends on the direction of application of a bias field $H_0$ that is applied to the YIG film. When $H_0$ is parallel to the surface of the YIG film and is parallel to the microstrip conductors, the resulting magnetostaic waves are referred to as surface waves. When $H_0$ is parallel to the surface of the YIG film and perpendicular to the microstrip conductors, the resulting magnetostatic waves are referred to as backward volume waves. When $H_0$ is perpendicular to the surface of the YIG film, the resulting magnetostatic waves are referred to as forward volume waves. In general, there is a non-linear relationship between the angular frequency $\omega = 2\pi f$ and the wavenumber k. This relationship is shown in FIG. 2 for all three orientations of $H_0$. In this figure, the anisotropic field is the magnetic field introduced by the anistropic structure of the crystal structure of the YIG film. For surface waves and forward volume waves, the frequency is an increasing function of wavenumber, but for backward volume waves it is a decreasing function of frequency. For surface waves and forward volume waves, the lowest order resonance occurs when m and n are both equal to 1.

In order to suppress excitation of the resonances for $m \neq 1$, microstrip conductors 12 and 15 were aligned parallel to side 13 to a high degree of accuracy. In addition, other techniques can be utilized to suppress these unwanted (spurious) resonances for $m \neq 1$ (see, for example, copending U.S. patent application Ser. No. 17/094,963 entitled MODE SELECTIVE MAGNETOSTATIC WAVE RESONATORS filed by Kok Wai Chang, et al on 9/2/87). Such precise alignment and the inclusion of these other modes of suppression of these spurious modes increases the cost of these resonators. Therefore, it would be advantageous to have a new, simpler and less expensive means of suppressing the unwanted resonances and of channelling a greater fraction of the input signal into the resonant mode of interest.

SUMMARY OF THE INVENTION

In accordance with the disclosed invention, as MSW resonator is presented in which the input transducer is oriented to produce travelling waves along the direction of a the wavevector of a travelling wave component of the resonant fundamental mode of interest. The output transducer is also oriented to be maximally responsive to one of the travelling wave components of the resonant fundamental mode of interest.

As discussed in the Background of the Invention, for a rectangular cavity, the resonant frequencies $f_{mn}$ occur for wavevectors $k_{mn}$ in which $k_x = \pm m \cdot \pi / L_x$ and $k_y = \pm n \cdot \pi / L_y$. Since a straight microstrip conductor launches MSW waves perpendicular to the axis of the microstrip conductor, this axis should be oriented perpendicular to the wavevector of the resonance mode of interest. For the mode $m = n = 1$, this results in the input and output microstrip conductors being oriented parallel to a diagonal of the rectangle. It is not necessary that they both be oriented parallel to the same diagonal. In fact, it is advantageous for them to be oriented parallel to different diagonals, because this significantly reduces unwanted crosstalk between the input and output microstrip conductors via direct transmission of radiowaves between them.

DESCRIPTION OF THE FIGURES

FIG. 2 illustrates the relationships between angular frequency and wavenumber for surface waves, backward volume waves and forward volume waves.

DESCRIPTION OF THE PREFERRED EMBODIMENT

Figure 3:
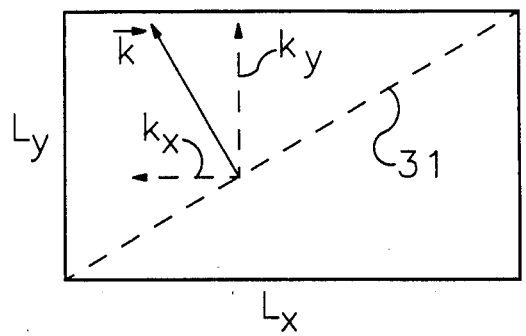
FIG. 3 illustrates the direction of the wavevector of one of the travelling wave components of the lowest frequency resonant mode of a rectangular cavity.

In FIG. 3 is shown a rectangular magnetostatic wave resonator cavity of width $L_x$ and width $L_y$ in which travelling waves are produced. In such a cavity, a resonant response results when the wavevector of induced waves has x and y components satisfying the relationships $(k_{mn})_x = \pm m \cdot \pi / L_x$ and $(k_{mn})_y = \pm n \cdot \pi / L_y$ (1)

respectively, for some integers m and n. The frequency of this resonant mode is indicated by $f_{mn}$ and the associated wavevector is represented by $k_{mn}$. The magnitude of $k_{mn}$ is represented by $k_{mn}$.

The resonant mode for $f_{mn}$ has the form $$A \cdot \sin[(k_{mn})_x \cdot x] \cdot \sin[(k_{mn})_y y] \quad (2)$$

where A is the amplitude of the resonant mode. This stationary state is really the superposition of the four travelling waves satisfying condition (1) above. Therefore, to excite this state, the input transducer should be aligned to generate at least one of these four travelling waves. As this wave reflects off of the end and side walls, the other three of these travelling waves will be produced and the resonant mode presented in equation (2) will result. Thus, it is only necessary that at least one of these travelling wave components of the stationary state resonant mode by excited by the input transducer.

Since a straight transducer will stimulate travelling waves perpendicular to the axis of the transducer, this axis should be oriented substantially perpendicular to the direction of the wavevector of the travelling wave component to be stimulated. Equivalently, the transducer should be parallel to the wavefront of the travelling wave component to be stimulated. Thus, in FIG. 3, dotted line 31 is the direction parallel to which the axis of the input transducer should be aligned in order to excited the travelling waves in the direction of the vector k in that figure and in the direction opposite to vector k. This orientation will be referred to herein as being such that "the transducer launches waves in the direction of the wavevector of one of the travelling wave components of the resonant mode signal".

The particular wavevector shown in FIG. 3 corresponds to the resonance for m=n=1. For this choice of resonant mode, line 31 is along a diagonal of the rectangle. This direction will not only couple to the mode with m=n=1, but will also couple to the modes with m=n≠1. However, the standing wave fundamental modes for m=n≠1 are different enough spatially that these other modes can be suppressed by other techniques such as are presented incopending patent application entitled MODE SELECTIVE MAGNETOSTATIC WAVE RESONATOR filed by Kok Wai Chang, et al on.

Figure 6:
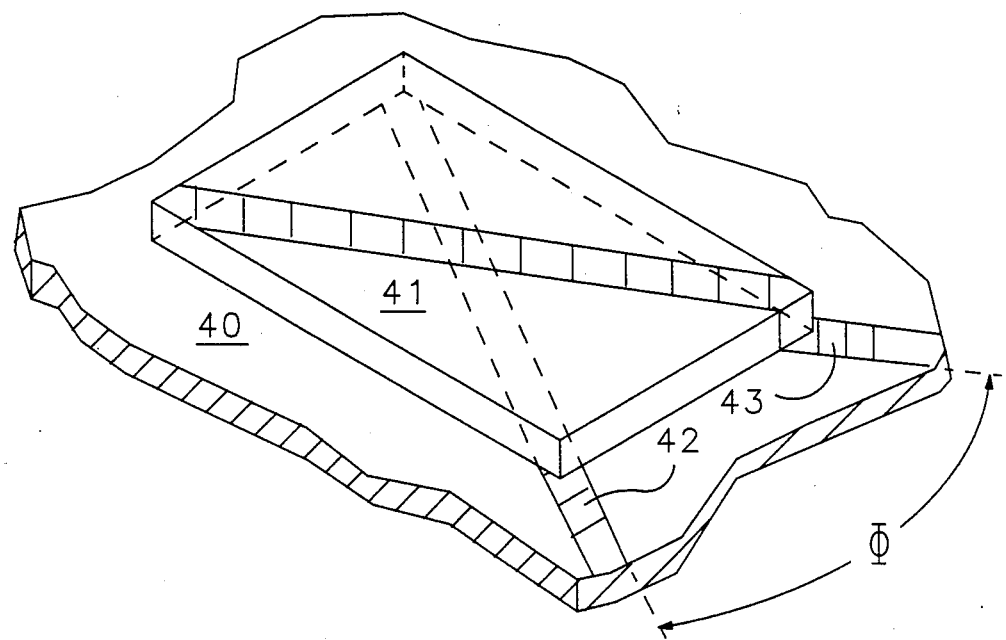
FIG. 6 shows a resonator in which the lowest order mode is to be excited and in which the microstrip transducers have a reduced amount of direct coupling by radio waves.
Figure 4:
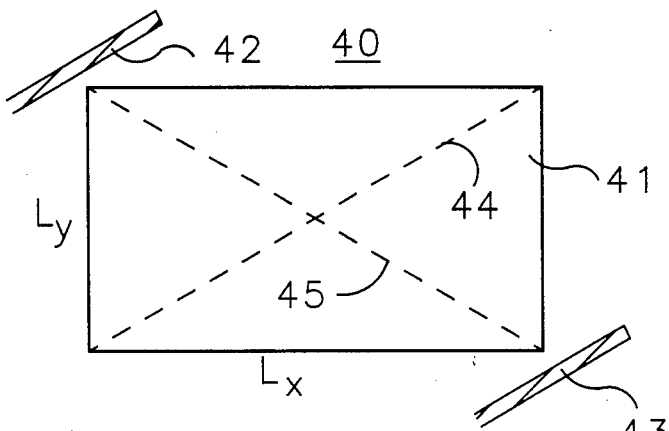
FIGS. 4 and 5 show two embodiment of the invention for an MSW resonator in which the lowest order resonant mode is to be excited.
Figure 5:
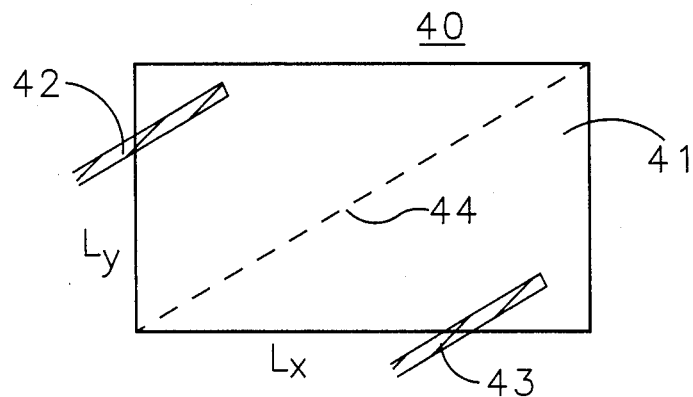

In FIGS. 4–6 are shown MSW resonators configured in accordance with the invention. In FIG. 4, the resonator consists of a thin film 41 of a magnetic material (such as a thin film of yttrium iron garnet) grown by liquid phase epitaxy (LPE) on a gadolinium gallium garnet substrate, a first microstrip conductor 42 that serves as an input transducer, and a second microstrip conductor 43 that serves as an output transducer. Both transducers are selected to be parallel to a diagonal 44 of YIG film 41. However, in other embodiments, either of microstrip conductors 42 or 43 can be selected to be parallel to diagonal 45. In this embodiment, the transducers are positioned so that they are adjacent to, but do not overlap, the YIG film. In the embodiment in FIG. 5, both transducers are positioned to overlap the YIG film.

Figure 1:
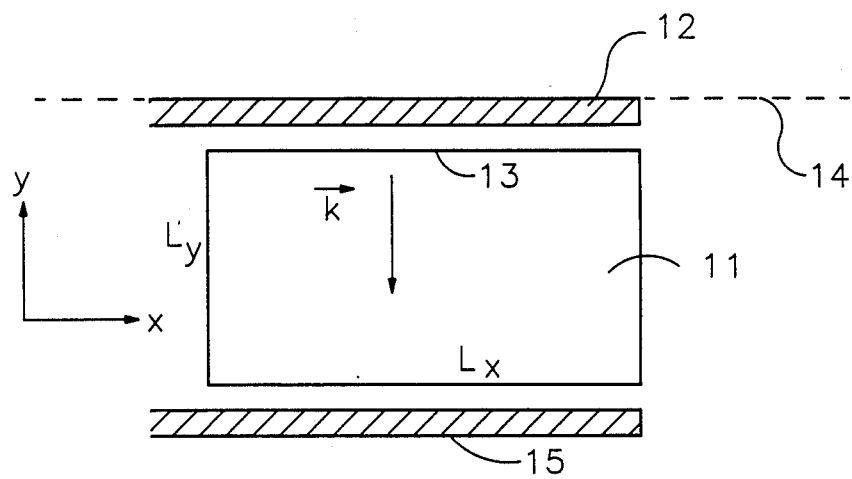
FIG. 1 shows a previous embodiment of an MSW resonator.

An additional advantage of orienting the transducers parallel to a diagonal of film 41 is that the length of transducer overlapping the YIG film can be increased in comparison to the prior art transducer in FIG. 1. Such a resonator, shown in FIG. 6, has its input microstrip 42 located on one diagonal and has its output microstrip conductor 43 located on the other diagonal of the YIG film. In FIG. 1, the overlapping portion of the transducer has a length $L_x$, whereas, in FIG. 6, the overlapping portion of the transducer has length $[L_x^2 + L_y^2]^{\frac{1}{2}}$. This increased overlap increases the coupling strength of electrical signals in the microstrip to magnetostatic wave resonances in YIG film 41. The embodiment in FIG. 6 has the further advantage that there is a reduced amount of coupling between conductors 42 and 43 via direct transmission of electromagnetic waves between them because there is a large relative angle Φ between these two conductors. For a square YIG film, this angle is 90° which minimizes the amount of direct coupling between conductors 42 and 43 via direct transmission of radio waves.

The maximization of the coupling into the resonant mode of interest not only increases the resonant response of that mode, it also reduces the amount of energy remaining which can be coupled into the other resonant modes. Thus, the ratio of the spurious modes to the selected mode is decreased because there is a reduced amount of energy in the spurious modes and an increased amount of energy in the selected resonant mode. For a precisely rectangular cavity with input and output conductors aligned precisely along a diagonal, the only modes excited have m=n. Thus, there is a significant reduction in the effects of spurious mode excitation. The lengths $L_x$ and $L_y$ can then be chosen to separate the resonances sufficiently that there is no significant overlap of neighboring resonant peaks.

Although the embodiment in FIGS. 4–6 all contain both an input and an output transducer, it should be noted that this invention is also applicable to one port resonators in which there is only a single transducer that functions as both the input and output transducers.

We claim:

1. A magnetostatic wave resonator comprising:
   a thin film magnetostatic wave resonant cavity having a rectangular cross-section of width $L_x$ and length $L_y$, said resonant cavity having a resonant mode that is a linear combination of the four travelling waves respectively having wavevectors
   $k_1 = (m\pi/L_x)e_x + (n\pi/L_y)e_y$,
   $k_2 = (-m\pi/L_x)e_x + (n\pi/L_y)e_y$,
   $k_3 = k_3 = m\pi/L_x)e_x + (-n\pi/L_y)e_y$, and
   $k_4 = (-m\pi/L_x)e_x + (-n\pi/L_y)e_y$ where m and n are finite nonzero integers and where $e_x$ and $e_y$ are unit vectors parallel to the sides of length $L_x$ and $L_y$, respectively; and
   a first linear transducer having an axis that is perpendicular to one of said $k_i$ (i=1, . . . ,4).

2. A resonator as in claim 1 wherein said transducer is located over the center of the rectangular cross-section of the resonator cavity.

3. A resonator as in claim 1 wherein m=n, whereby the first transducer is parallel to a diagonal of the rectangular cross-section.

4. A resonator as in claim 3 further comprising a second transducer that is parallel to a diagonal of the rectangular cross-section of the resonator cavity.

5. A resonator as in claim 4 wherein the first and second transducers are each parallel to a different diagonal of the rectangular cross-section of the resonator cavity, whereby the direct coupling between these two transducers via radio waves is reduced below the direct coupling that results when these two transducers are parallel.

6. A resonator as in claim 5 wherein the resonator cavity has a square cross-section, whereby the two transducers are perpendicular, thereby minimizing, as a function of orientation of these transducers, the direct coupling between these transducers by radio waves.

* * * * *